United States Patent [19]

Goldman et al.

[11] 4,369,031

[45] Jan. 18, 1983

[54] GAS CONTROL SYSTEM FOR CHEMICAL VAPOR DEPOSITION SYSTEM

[75] Inventors: Jon C. Goldman, Orange; Robert E. Rappaport, Westminster, both of Calif.

[73] Assignee: Thermco Products Corporation, Orange, Calif.

[21] Appl. No.: 302,003

[22] Filed: Sep. 15, 1981

[51] Int. Cl.$^3$ .................. F27B 5/04; F27D 19/00; B05C 19/02
[52] U.S. Cl. .................................. 432/198; 118/715; 118/724; 427/85; 432/55
[58] Field of Search .................. 432/55, 198; 118/715, 118/724; 427/85

[56] References Cited

U.S. PATENT DOCUMENTS

| | | | |
|---|---|---|---|
| 3,396,955 | 8/1968 | Martinek | 432/198 |
| 3,917,238 | 11/1975 | Gohring | 432/198 |
| 4,098,923 | 7/1978 | Alberti et al. | 427/85 |
| 4,100,310 | 7/1978 | Ura et al. | 427/85 |
| 4,138,306 | 2/1979 | Niwa | 118/715 |
| 4,217,375 | 8/1980 | Adams | 427/85 |

Primary Examiner—John J. Camby
Attorney, Agent, or Firm—George R. Clark; Neil M. Rose; Clifford A. Dean

[57] ABSTRACT

A gas flow control system in which several constituent gases are mixed and the mixture delivered through controlled injectors to a processing zone. Mass flow controllers control the injector flows with one of the controllers being a master and the other being slaved to provide a selected percentage of the flow through the master controller. The gas mix is regulated by a mass flow controller on one of the constituents and a flow meter on the other, the flow meter producing an error signal which is used to readjust the total flow through the injectors by control of the master injector flow controller.

14 Claims, 7 Drawing Figures

GAS CONTROL SYSTEM FOR CHEMICAL VAPOR DEPOSITION SYSTEM

BACKGROUND OF THE INVENTION

This invention relates to a gas flow control system for use in a low temperature oxide chemical vapor deposition system. More particularly, the invention relates to a system in which mass flow controllers are used to control the flow of gases through a plurality of gas injectors positioned within the reaction tube of a vacuum low temperature oxide chemical vapor deposition system.

In the fabrication of semiconductor devices, it is desirable to deposit layers of silicon dioxide, which is a dense, chemically inert dielectric material having extreme hardness, low thermal conductivity and high resistance to molecular diffusion. Silicon dioxide is used, not only as an intermediate dielectric layer of multilayer metal devices, but it is also used in connection with doped silicon dioxide.

It has, in the past, been found to be difficult to deposit silicon dioxide onto semiconductor substrates in a manner which will produce uniform layers having a high quality free of defects in an economical manner. The art has developed from the use of one-atmosphere systems utilizing so-called cold wall furnaces to low pressure or partial vacuum deposition systems in which the silicon dioxide is deposited by oxidizing silane on the surfaces of the semiconductor substrates, which are heated inside an evacuated chamber. In the case of deposited, doped silicon dioxide layers, gases, such as phosphine, are mixed with silane to deposit a doped silicon dioxide. The heating of the substrates prior to deposition is accomplished in a standard diffusion furnace in which the diffusion tube is provided with means for evacuating the gases contained therein prior to the introduction of the silane, phosphine and oxygen. Although the low pressure deposition provides substantial advantages over the one-atmosphere process, there are substantial difficulties in obtaining the desired uniformity of deposition, as well as the freedom from surface defects. The prior art patent to Alberti et al., U.S. Pat. No. 4,098,923, discloses a low pressure silicon dioxide deposition system, which includes a number of features to improve the uniformity of the layer deposited on the various substrates positioned vertically down the processing tube, as well as across the wafer uniformly on the substrates. The various means utilized in the Alberti et al. patent to achieve this improved uniformity involve the use of a shroud in connection with the wafer supporting boat to improve the distribution of the mixed gases across the substrates supported in the boat. In addition, the mixed gases, such as silane and phosphine and the oxygen to react therewith, were delivered not at the end of the process tube as in the prior art, but through injectors extending lengthwise of the process tube adjacent the substrate boat. These injectors were provided with openings, again positioned adjacent the substrate supporting boat, to deliver the various gases directly to the deposition area. Also disclosed in the Alberti et al. patent were valves and flow control means so that the flows and the proportions of the various gases could be controlled.

Subsequent to the filing of the Alberti et al. application, there was developed a further modification of the gas injector structure in which a plurality of separately controlled gas injectors were provided in order that the volume of mixed gas delivered in the various areas lengthwise of the tube could be altered or adjusted. In one commercial embodiment, there were five separate injectors, each having a plurality of holes to deliver a controlled flow of mixed gas to a lengthwise segment of the process tube. The rate of flow and distribution of the oxygen being less critical, there were only two injector tubes having openings to supply oxygen throughout the length of the processing zone. Although the commercial embodiments of the above described low pressure chemical vapor deposition system were equipped with flow meters and manually adjustable valves to control the rates of flow to the various gas injectors, it was known generally in the art of chemical vapor deposition systems to provide individual mass flow controllers for each of the gas injectors.

BRIEF DESCRIPTION OF THE INVENTION

The invention involves the utilization of a plurality of mass flow controllers to regulate the gas flow to each of the injectors supplying the mixed gases to the processing tubes. In order to facilitate adjustment of the process, the flows through all of the mixed gas injectors but one are tied into or slaved to the mixed gas flow controllers for said one injector. This permits the slaved controllers to be set for a specific percentage of the flow of the master controllers by which they are controlled. The quantities of the gases which are mixed in a manifold from which the various injectors are fed are controlled in a novel manner. The dopant or phosphine gas flow is controlled by a mass flow controller, while the silane flow into the manifold is controlled by the controllers on the injectors and is monitored by a flow meter. The flow meter signal, when compared with the silane setpoint, produces an error signal which is used to electronically adjust the setpoint on the master flow controller to compensate for the error. Because of their relationship to the master, the slave controllers also undergo a correction. This provides a simple and effective means of regulating the gas flow in the system to achieve the desired flows. It also provides a means whereby the relative flows to the various injectors could be modified easily to obtain improved uniformity without altering the overall flow or the percentage mixture of the gas which has been previously selected. It provides an arrangement in which proportions or amounts of the constituent gases may be modified without changing the relative properties of the mixed gas delivered through the individual injectors.

It is, therefore, an object of the present invention to provide an improved gas distribution system for a low temperature oxide chemical vapor deposition system. It is a further object of the present invention to provide an improved gas control system for a chemical vapor deposition system in which mass flow controllers are used on a plurality of individual gas injectors to deliver selected volumes of mixed gases to areas disposed lengthwise in an evacuated process tube.

It is another object of the present invention to provide an improved low temperature oxide chemical vapor deposition system in which mass flow controllers are utilized on the individual injectors and a mass flow controller is used on one of the constituent gases, while a flow meter is used on the other constituent gas whereby the flow meter produces an error signal responsive to deviations from a setpoint to control the overall volume of gas passed by the mass flow controllers associated with the injectors.

It is still another object of the present invention to provide an improved low temperature oxide chemical vapor deposition system in which there are a plurality of mixed gas injectors associated with the process tube, each injector having the flow therethrough controlled by a mass flow controller, one of which is a master controller and the others of which are slaved to the master controller.

Other objects of the present invention will become obvious to one skilled in the art upon a perusal of the specification and claims in light of the accompanying drawings:

Figure 1:
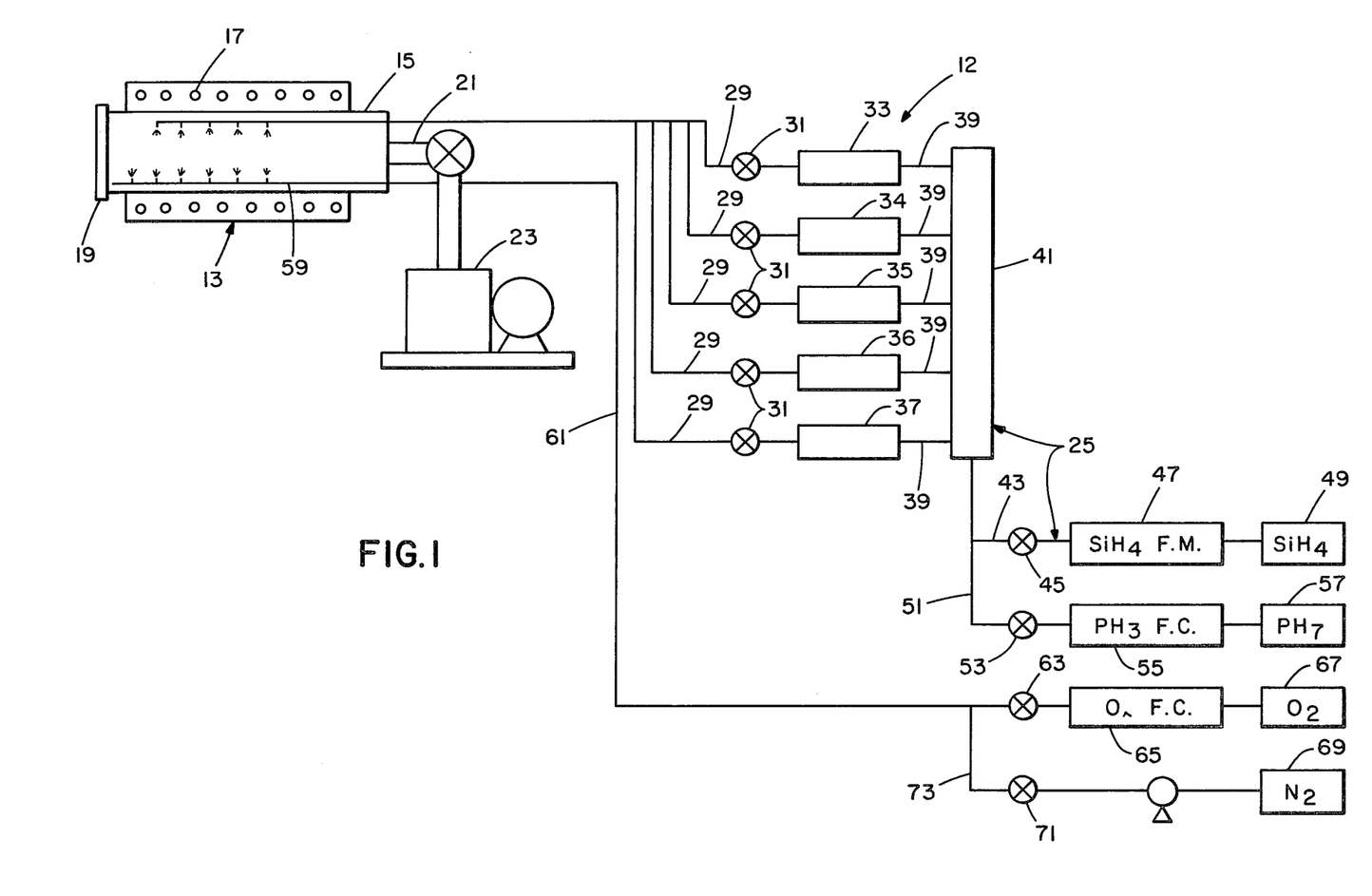
FIG. 1 is a flow diagram of the gas flow control system which embodies our invention.

Referring to the drawings, FIG. 1 provides a flow diagram which comprises a schematic showing of a combined diffusion furnace and gas flow control system designated generally by reference numeral 12. The combination includes a diffusion furnace 13 having a process tube 15 surrounded by a heating element 17. The process tube 15 is conventionally quartz or stainless steel and capable of being sealed against atmospheric pressure. One end of the process tube 15 is provided with a sealed closure member 19 which may be readily removed for the purpose of loading boats containing wafers into the process tube 15. The end of the process tube remote from the closure member 19 is provided with an enlarged outlet 21 to which a vacuum pumping system 23 may be connected. Details of a suitable vacuum pump system are disclosed and claimed in Foster U.S. Pat. No. 4,228,004 which is assigned to the same assignee as the present application.

The combination 12 further includes a gas supply system 25 by means of which controlled quantities of gas may be delivered to the process tube 15. In a typical system capable of performing low temperature, low pressure chemical vapor deposition processes, there are means for supplying various gases such as silane, $SiH_4$, and dopant gases such as phosphine, $PH_3$. Often, the dopant is premixed in the gas supply bottle with a carrier gas such as nitrogen or argon, which does not enter into the reaction. In addition, it is necessary to deliver oxygen and alternatively nitrogen to the process tube 15. As shown in the schematic drawing of FIG. 1, pressurized sources of the necessary gases such as silane, phosphine, oxygen and nitrogen consist typically of metallic containers which are connected by suitable stainless steel connectors to the system 25.

Figure 2:
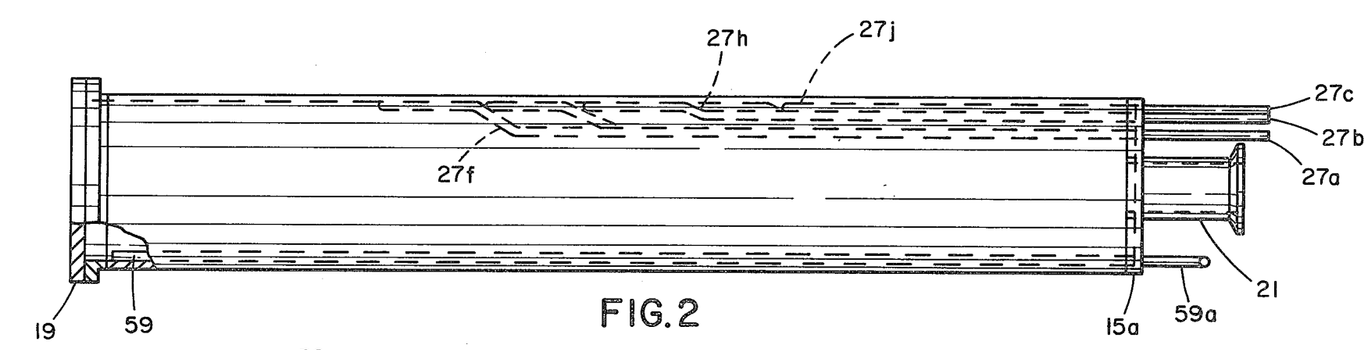
FIG. 2 is a side elevational view of a typical process tube for use in our gas flow control system, partially sectioned and with the center portion cut away for convenience.
Figures 3, 4:
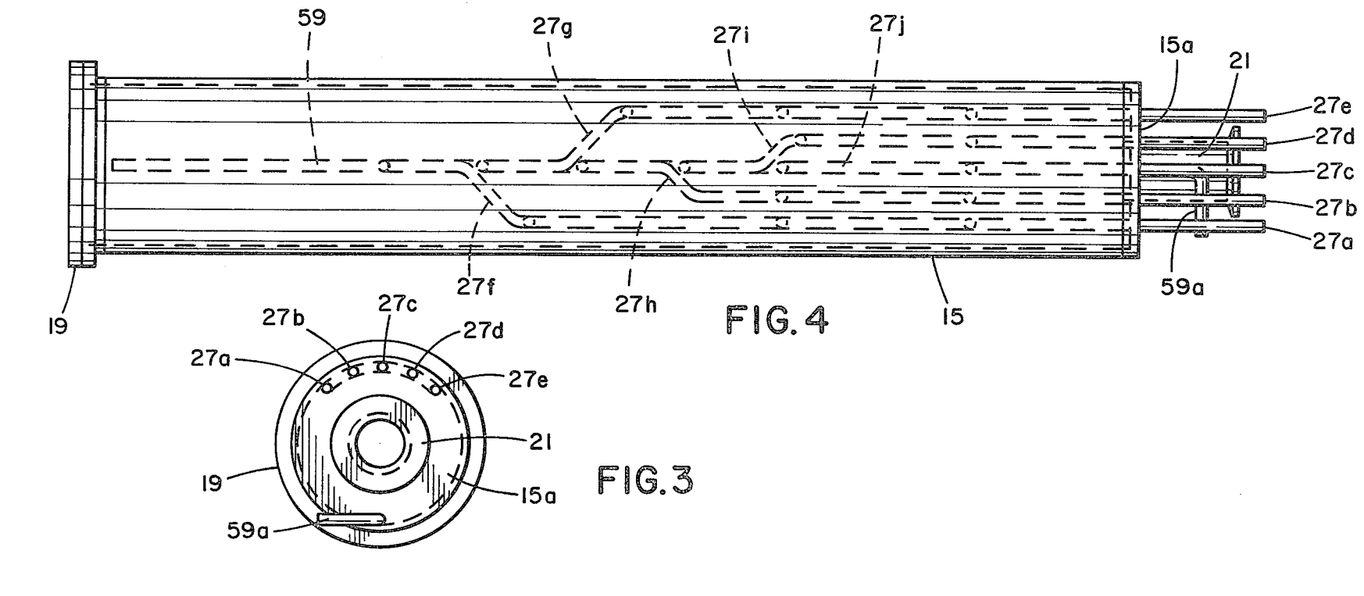
FIG. 3 is an end view of the process tube of FIG. 2.
FIG. 4 is a top plan view of the process tube of FIG. 2.

In order to distribute the silane or the mixture of silane and phosphine to the process tube 15, there are provided a plurality of injector tubes 27 which are best shown in FIGS. 2 through 4. There are five injector tubes 27, which are individually designated as 27a, 27b, 27c, 27d and 27e, distributed across the upper 90° quadrant of the process tube 15 as is shown in FIG. 3. The injector tubes 27a through 27e have portions which extend externally from the process tube 15 through end wall 15a of the process tube adjacent to the exhaust passage 21. In addition, the injector tubes extend into the interior of the process tube 15 varying distances as may be best seen from FIG. 4. The inner ends of four of the injector tubes have somewhat Z-shaped portions 27f, 27g, 27h and 27i, with the central tube 27c having a straight end portion 27j. The portions of the injector tubes 27 lying along the central axis of the process tube 15 as viewed from above in FIG. 4 are perforated to provide gas delivery openings spaced continuously along the central portion of the process tube 15. The injector 27c has only the inner end portion provided with perforations so that each of the injector tubes 27 has a perforated portion about 6 to 7 inches in length providing a total length over which gas distribution is occurring of about 35 to 40 inches. The injector tubes 27 are connected by individual conduits 29 through solenoid shutoff valves 31 to mass flow controllers 33, 34, 35, 36 and 37. The mass flow controllers may be of any commercially available type for the accurate control of small flow volumes of gas but may be of the type disclosed in the co-pending application of Doyle, Ser. No. 193,876, filed Oct. 3, 1980. The mass flow controllers are connected through conduits 39 to a manifold 41 in which various reactant gases may be mixed.

In order to supply silane to the manifold 41, conduit 43 connects through a solenoid shutoff valve 45 and a mass flow meter 47 to the silane supply 49. Similarly, a conduit 51 connects the manifold 41 through shutoff valve 53 and a mass flow controller 55 to the phosphine supply 57.

Before considering the detailed aspects of the gas flow control system, brief mention should be made of the reason for including the five injector tubes 27. As was mentioned in the introductory portion, the deposition of silicon dioxide at low temperature and pressure occurs very rapidly and is difficult to control. As mentioned in the Alberti et al. U.S. Pat. No. 4,098,923, the wafer containing boat may be provided with a shroud which has limited openings and tends to even out the distribution of gas to the wafers supported therein. However, even with the use of such a shroud and with gas injectors located throughout the length of the area in which the wafers are supported, there are still problems with obtaining uniform deposition on all of the wafers down the length of the process tube and uniform deposition across the surface of each wafer which is normally positioned perpendicular to the axis of the process tube. It is known in the art to provide a plurality of separate injector tubes such as the tubes 27a through 27e to provide means for varying the relative amounts of the reactant gases over various portions of the length of the process tube. The prior art gas systems have involved the use of either manually controlled valves for each of the individual injectors or in some cases mass flow controllers which may be set to selected rates of flow for each of the injector tubes. However, the flow pattern through the various injector tubes must be determined empirically and seems to depend on many unknowns relating to patterns of gas flow, temperature differentials and the like which seem to be difficult to establish or control. Because of the empirical nature of the establishment of the optimum gas flow pattern, it would be desirable to provide the maximum flexibility in adjusting the relative flows in the various injector tubes and it would be desirable to be able to vary the overall flow or composition of the gas mixture without changing the relative proportions of the flows through the various injectors. As will be evident from the ensuing description, the arrangement of the flow controllers on the various injector tubes, and the control means associated with them, provide far more flexibility than, and significant advantages over, any of the prior art gas systems. The oxygen is supplied to the process tube 15 by means of a single tube 59 located centrally at the bottom process tube as best shown in FIGS. 2 and 3. The oxygen tube 59 has openings throughout its length and includes an end portion 59a which extends through the end wall 15a of the process tube 15 and is connected by means of a conduit 61 through a solenoid shutoff valve 63 and a mass flow controller 65 to the oxygen supply 67. For the purpose of purging the system and for other purposes, a nitrogen supply 69 is connected through a solenoid valve 71 and conduit 73 to the conduit 61 which also serves to supply the oxygen to the injector 59.

Before proceeding to a consideration of the specific details of the control circuitry for the gas distribution system 25, there are several basic aspects of the system which should be noted and kept in mind. First, the mass flow controller 33, which controls the flow $F_1$, serves as the master controller for the injectors with the other four mass flow controllers 34, 35, 36 and 37 (which control the flows $F_2$, $F_3$, $F_4$ and $F_5$), being provided with controls which relate their flows to the flow through $F_1$ on a percentage basis. Thus, the setpoint controls for controllers 34, 35, 36 and 37 respectively, provide flows $F_2$, $F_3$, $F_4$ and $F_5$ which are a percentage of the flow through $F_1$.

The second basic aspect of the system is that the flow of silane is controlled only by the flow controllers 33 through 37 on the individual injectors, there being only the mass flow meter 47 on the silane line so that there is no single controller of that flow. The phosphine is regulated by a separate mass flow controller 55.

The advantages resulting from these aspects of the system all relate to flexibility in permitting control of the flow ratios in the various injectors without affecting the overall quantity or mix of the gas or in permitting changes in the overall quantity or mix without affecting the ratios delivered by the individual injectors.

In considering the functions performed by the gas flow control system 25, it will be helpful to analyze the relationships between the gas flows present in different places in the system. For simplicity's sake, we will consider the total gas flow of the constituent gases to be equal to FT with the individual gas flows of silane and phosphine to be represented by $F(SiH_4)$ and $F(PH_3)$, respectively. According to these definitions, the relationship between these gas flows may be expressed by equation (1) as follows:

$$FT = F(SiH_4) + F(PH_3) \tag{1}$$

Since the total gas flow which will be delivered to the manifold 41 will also be discharged through the individual injectors 27a through 27e, it is obvious that the total gas flow equals the sum of the gas flows through the various injectors. When the flows through the injectors 27a, 27b, 27c, 27d and 27e are represented by $F_1$, $F_2$, $F_3$, $F_4$ and $F_5$, respectively, the relationship between the total flow and the injector flow may be expressed by equation (2) as follows:

$$FT = F_1 + F_2 + F_3 + F_4 + F_5 \tag{2}$$

Substituting from equation (1) into equation (2), we arrive at equation (3) as follows:

$$F(SiH_4) + F(PH_3) = F_1 + F_2 + F_3 + F_4 + F_5 \tag{3}$$

As will be explained more fully in connection with the schematic diagram for the control circuit, the flows to the injectors 27b, 27c, 27d and 27e, designated as $F_2$, $F_3$, $F_4$ and $F_5$, are set or controlled as a percentage of the flow through injector 27a, or in other words as a percentage of $F_1$. This is accomplished by setting a potentiometer calibrated from 0% to 100% for each flow; these percentages will be designated as the setpoints for the various slaved flow controllers and will be represented as SP.2, SP.3, SP.4 and SP.5, indicating the setpoints for these mass flow controllers 34, 35, 36 and 37. Thus, the slaved controller or injector flows may be expressed as equations (4) through (4d) as follows:

$$F_2 = SP.2(\%) \times F_1 \tag{4a}$$

$$F_3 = SP.3(\%) \times F_1 \tag{4b}$$

$$F_4 = SP.4(\%) \times F_1 \tag{4c}$$

$$F_5 = SP.5(\%) \times F_1 \tag{4d}$$

If we substitute the above expressions for $F_2$, $F_3$, $F_4$ and $F_5$ into equation (3) and then if we factor $F_1$ from the righthand side of the equation, we obtain equation (5) as follows:

$$F(SiH_4) + F(PH_3) = (SP.2 + SP.3 + SP.4 + SP.5 + 1)F_1 \tag{5}$$

If we solve equation (5) for $F_1$ we obtain equation (6) as follows:

$$F_1 = \frac{F(SiH_4) + F(PH_3)}{SP.2 + SP.3 + SP.4 + SP.5 \ 5 + 1} \tag{6}$$

In order to assure accurate control of the flow of silane, $(F(SiH_4))$, there is provided the flow meter 47 which monitors the flow of silane from the supply 49 to the manifold 41. As will be explained in detail in connection with the schematic diagram of FIGS. 6A and 6B, the control circuit includes means for selecting the rate of flow of silane which is then the silane setpoint and the various injector flow controllers will then regulate their respective flows to produce the selected silane flow. To improve the accuracy and speed of corrective response of the system, the actual flow of silane as measured by the flow meter 47 is compared with the setpoint value of silane flow to provide an error signal which may be used to correct the injector flows and rebalance the system. It is also noted that when the flow error is beyond the capability of the system to correct, due to a blocked mass flow controller or an incorrect slave setpoint setting, an error signal is generated to light a signal light informing the operator that the flow is less than the setpoint value.

The use of the error signal to rebalance the flow rates may be reflected in a modified version of equation (6), which shows the error signal as added to or subtracted from the total flow as follows in equation (7):

$$F_1 = \frac{F(SiH_4) + F(PH_3) \pm (SiH_4 \text{ Error})}{SP.2 + SP.3 + SP.4 + SP.5 + 1} \quad (7)$$

If the metered flow through flow meter 47 corresponds with the setpoint silane flow, there will, of course, be no error signal and the expression for the $SiH_4$ Error would be equal to zero. Otherwise, the flow $F_1$ will be modified to accomplish the adjustment to eliminate the error.

Figure 5:
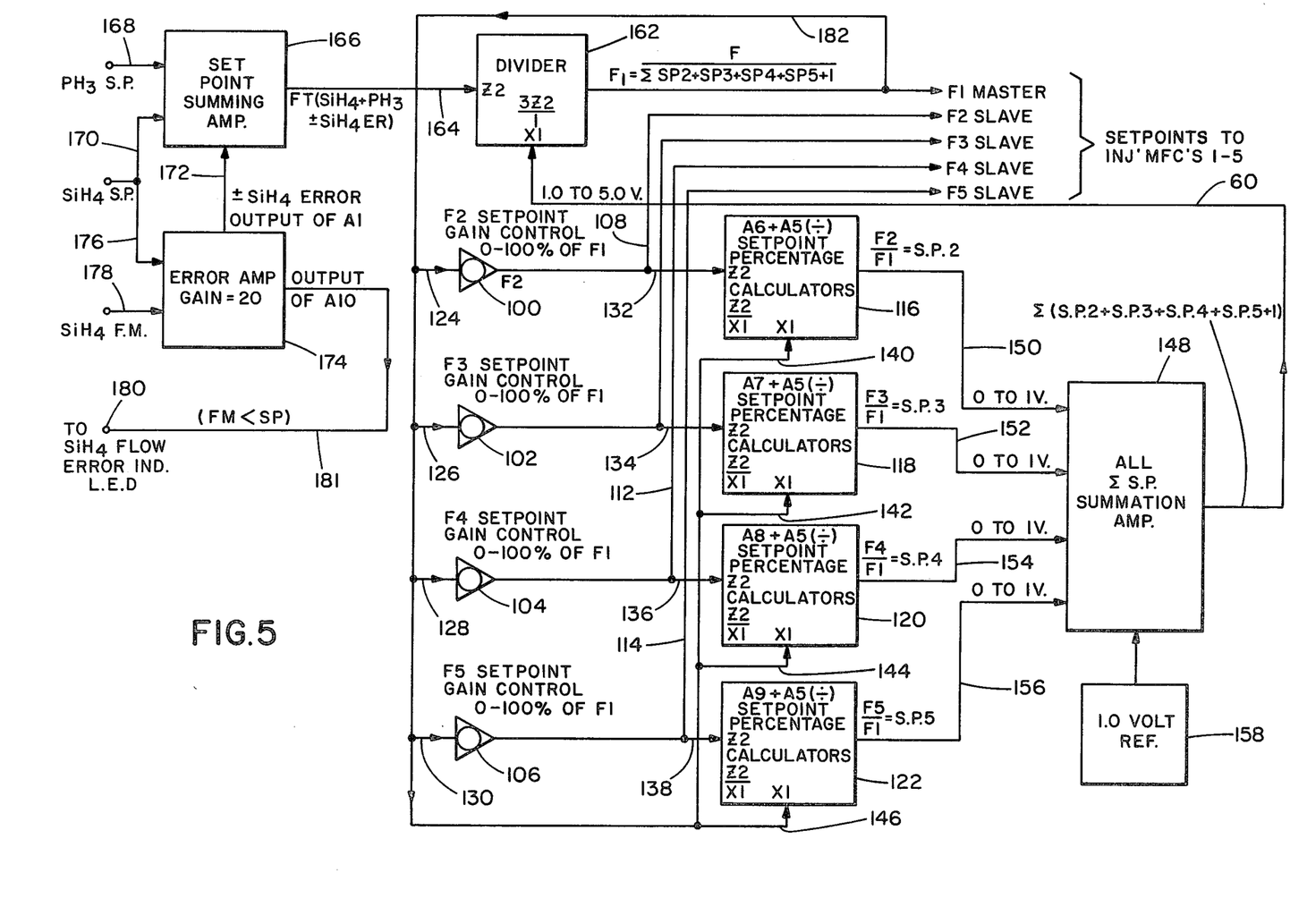
FIG. 5 is a block diagram of the control circuit for the gas flow control system.

Reference will now be made to the block diagram of FIG. 5 for the purpose of explaining the functions performed by the various portions of the control circuit. Associated with each of the slaved injector mass flow controllers 34, 35, 36 and 37 is a setpoint gain control designated 100, 102, 104 and 106, respectively. The individual setpoint gain controls produce a voltage signal which is delivered through lines 108, 110, 112 and 114 to the respective mass flow controllers 34, 35, 36 and 37 to provide the rates of flow which are the selected percentages of the flow $F_1$ as controlled by master injector mass flow controller 33. As will be explained in the detailed analysis of the circuit of FIGS. 6A and 6B, each of the setpoint gain controls includes an adjustment control which permits the selection of a rate of flow from 0% to 100% of the $F_1$ flow for the respective mass flow controllers.

The outputs of the setpoint gain controls are also connected to setpoint percentage calculators 116, 118, 120 and 122 by connectors 132, 134, 136 and 138, respectively. A voltage signal which is equal to the flow $F_1$ is also fed to the setpoint gain controls 100, 102, 104 and 106 through connectors 124, 126, 128 and 130, respectively. The setpoint gain controllers function to multiply the $F_1$ voltage signal by the particular set percentage to produce output voltages proportional to the $F_2$, $F_3$, $F_4$ and $F_5$ flow rates as expressed in equations (4a), (4b), (4c) and (4d). These flow rate voltages are fed to the slaved injector mass flow controllers 34, 35, 36 and 37 by the leads 108, 110, 112 and 114.

The voltage signal equal to $F_1$ is also fed through connectors 140, 142, 144 and 146 to setpoint percentage calculators 116, 118, 120 and 122. The setpoint percentage calculators 116, 118, 120 and 122 output signals which are respectively proportional to the ratio of the flow rates through the slaved injector mass flow controllers 34, 35, 36 and 37 divided by the flow rate through master injector mass flow controller 33 and may vary between 0 and 1 since the rates of flow of the slaved mass flow controllers 34 ($F_2$), 35 ($F_3$), 36 ($F_4$) and 37 ($F_5$) may never be greater than that of the master controller 33 ($F_1$). These ratios which represent the setpoints SP.2, SP.3, SP.4 and SP.5 are each represented by signals from 0 to 1 volt which are then supplied to a summation amplifier 148 through connectors 150, 152, 154 and 156 where they are added along with a one volt reference signal supplied from a source 158. The one volt signal is representative of the 100% flow rate through master controller 33.

The output of the summation amplifier 148, which is equal to the denominator of equation (6), is fed through connector 160 to the divider 162. The divider 162 is also fed a signal equal to the sum of the phosphine setpoint, silane setpoint, and silane error signals through a connector 164. By dividing the total flow by the sum of the slaved mass flow controller setpoints plus 1, there is provided at the output of divider 162, a voltage equal to the desired flow $F_1$ through master mass flow controller 33 as expressed in equation (6).

To provide the above described total flow or FT signal, there is provided a summing amplifier 166 which receives a voltage signal equal to the phosphine setpoint through connector 168, a voltage signal equal to the silane setpoint through connector 170 and a silane error signal through connector 172. The silane error signal is generated in the error amplifier 174 which receives the silane setpoint voltage signal through a connector 176 and a signal equal to the actual silane flow as indicated by the flow meter 47 through a connector 178. The error amplifier 174 compares the setpoint silane voltage with the output from the silane flow meter 47 producing the error signal which is fed through the connector 172 to the summing amplifier 166. A second output from the error amplifier 174 is to an error indicator light emitting diode 180 through a connector 181 to produce a visual signal when the silane error exceeds a predetermined level and is not correctable.

Figure 6A:
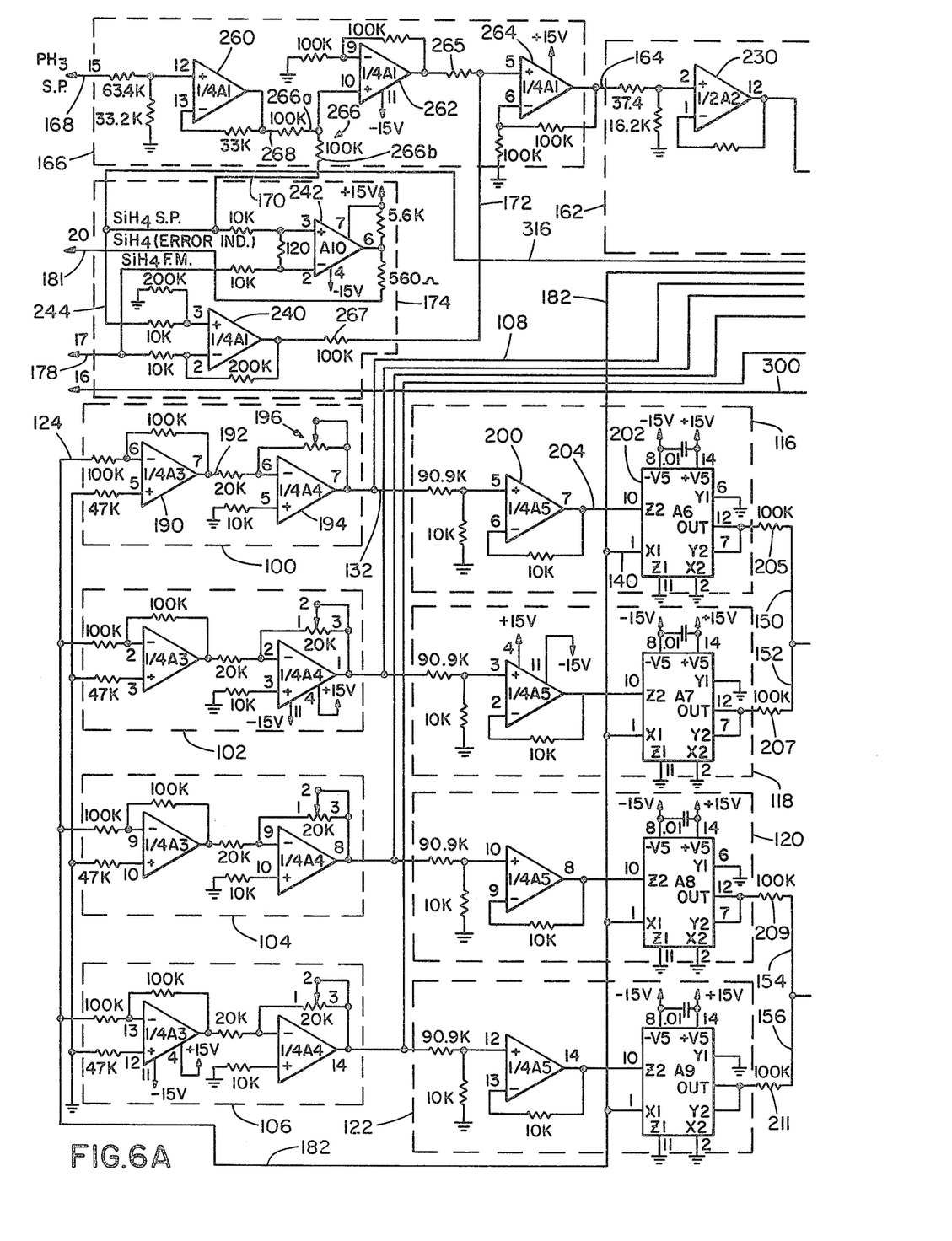
FIGS. 6A and 6B are a schematic diagram of the control circuit.
Figure 6B:
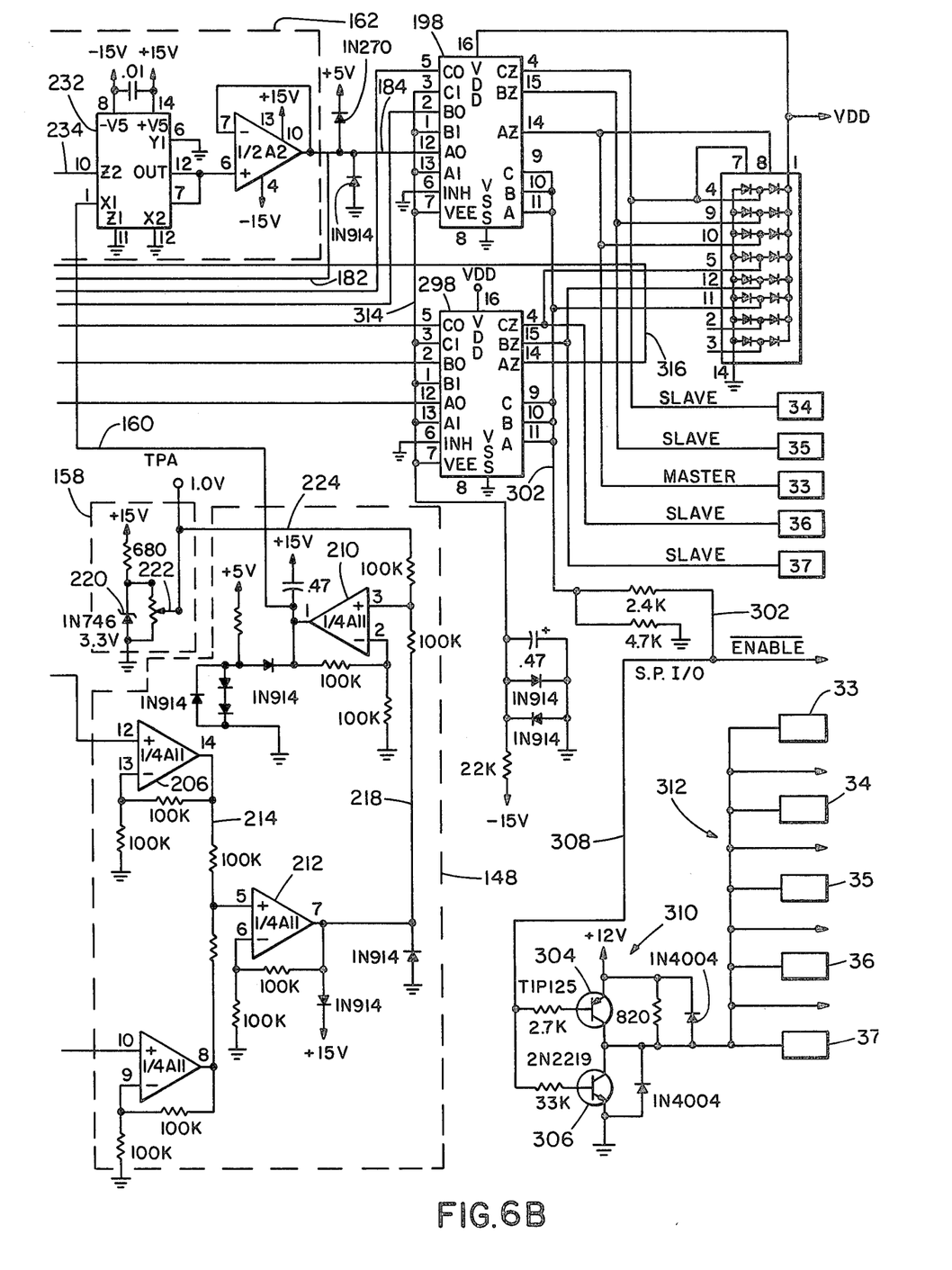

The output signal from divider 162, as stated above, is a voltage equal to the $F_1$ flow or the total gas flow divided by the sum of the setpoints of the slaved controllers plus 1 as expressed in equation (6). This output is supplied by connector 182 to the setpoint gain controls 100, 102, 104, 106 and to the setpoint percentage calculators 116, 118, 120 and 122 as shown in FIGS. 6A and 6B. Another connector 184 supplies the $F_1$ voltage signal to master mass flow controller 33.

The foregoing description sets forth completely the manner in which mass flow controllers 33, 34, 35, 36 and 37 for the individual injectors, the phosphine mass flow controller 55, and the silane flow meter 47 are functionally interrelated in the gas control system 25. There is shown in FIGS. 6A and 6B, the specific circuitry from accomplishing their functions. It should be appreciated that variations or alternative circuitry may be employed to perform such functions.

In the specific embodiment constructed in accordance with the teachings of the present invention, mass flow controllers having various flow capacities were used to control the individual injector flows as well as the phosphine and oxygen flows. Typical of applications such as these, a standard full-flow control voltage is used on each of the various controllers, which in this instance, was 5 volts. In the case of the individual injector mass flow controllers 33, 34, 35, 36 and 37, the maximum flow was 50 standard cubic centimeters per minute (sccm) with a control voltage of 5 volts. The phosphine mass flow controller was calibrated for a mixture of 15% phosphine, 85% nitrogen, and had a maximum flow rate of 100 sccm for a 5 volt control voltage. The silane flow meter produced a 5 volt voltage in response to a maximum flow of 150 sccm of silane. From the above, it is evident that the flow rates through the various mass flow controllers and the silane mass flow meter, are not all equal for a single control voltage signal. Considering first the phosphine, the ratio of the rate of flow to signal amplitude would be 20 sccm per volt, while on the individual injectors, the ratio would be 10 sccm per volt. As to silane, the ratio would be 30 sccm per volt. In the above analysis of the gas flow control system 25, referring to the functions performed by the different portions of the circuit, we indicated that the voltage signals were proportional to the gas flows. In the analysis of the circuit to follow, it will be noted that there are multipliers used which compensate for the lack of correspondence between the ratios of the rates of flow to signal amplitude on the various mass flow controllers and the flow meter.

Turning now to FIGS. 6A and 6B, we will consider first the circuitry associated with the setpoint gain controls 100, 102, 104 and 106. Since each of these gain controls is identical, a detailed description will only be made of setpoint control 100, which relates to the flow through mass flow controller 34 or the flow $F_2$. The dotted rectangular enclosure, designated as 100 in FIG. 6A, encloses two operational amplifiers A-3 and A-4, each of which is a portion of a National Semiconductor LM324N Quad Op-Amp. The first of these operational amplifiers designated by reference numeral 190, has its positive or noninverting input terminal connected through a 47K resistor to ground, while the negative or inverting input terminal is connected through a 100K resistor to connectors 124 and 182 to the output of the divider 162. This connection provides a voltage signal at the negative or inverting terminal of the op-amp 190 equal to the $F_1$ voltage signal. The inverting terminal of the op-amp 190 is connected through a 100K feedback resistor to the output terminal. Op-amp 190 provides a negative or inverted $F_1$ voltage signal at the output.

This inverted output is supplied through a lead 192 through a 20K resistor to the inverting terminal of a second operational amplifier 194 which is also a portion of an LM324N Quad Op-Amp. The noninverting input terminal of the operational amplifier 194 is connected through a 10K resistor to ground. The inverting input terminal of the op-amp 194 is connected in a feedback loop through a variable resistor 196 to the output terminal. The variable resistor 196 provides a resistance of from 0 to 20K permitting the gain of the op-amp 194 to be varied from 0 to $-1$.

The variable resistor 196 comprises the setpoint control SP.2 for the mass flow controller 34 and is calibrated in percent from 0% to 100%. With the 100% setting, the full 20K resistance is provided between terminals 6 and 7 thereby providing a simple inversion and unity gain in the op-amp 194. If it is desired that the flow through mass flow controller 34 be equal to the flow through mass flow controller 33, the master controller, the variable resistor 196 is set for the maximum resistance, providing unity inverting gain in the op-amp 194, thereby supplying a positive voltage equal to $F_1$ in the output. The output signal from the $F_2$ setpoint gain control 100 is connected by lead 108 to a National Semiconductor CD4053B two-channel analog multiplexer/demultiplexer 198. The signal delivered to the multiplexer 198, through lead 108, ultimately is supplied to the slaved injector mass flow controller 34. The output of the setpoint gain control 100 is also connected through a lead 132 to the setpoint percentage calculator 116, where it is used to provide one of the components used in calculating $F_1$, the flow through the master flow controller 33.

Setpoint percentage calculator 116 used in connection with the setpoint for flow controller 34, is identical in structure and function to the other setpoint percentage calculators 118, 120 and 122 and, therefore, only the circuitry of 116 will be described in detail.

The setpoint percentage calculator 116 includes an operational amplifier 200 and integrated circuit two-quadrant divider 202. The op-amp 200 is a portion of an LM324N, supplied by National Semiconductor, and the circuit divider 202 is an Analog Devices AD535. The lead 132 supplied the input $F_2$ voltage signal through a 90.9K resistor to the noninverting terminal 5 op-amp 200, which is also connected through a 10K resistance to ground. The inverting input terminal 6 of the op-amp 200 is connected through a 10K resistance feedback loop to the output terminal 7. With this arrangement, the $F_2$ voltage signal is attenuated by a factor of 10 and is supplied through lead 204 to terminal Z2 of the two-quadrant divider 202, and the $F_1$ voltage signal is supplied through leads 182 and 140 to the terminal X1 of the divider 202. The divider 202 is internally configured such that the signal input at terminal Z2 is multiplied times 10 and divided by the X1 signal input producing the quotient at the output terminal as shown. As a consequence of the fact that the $F_2$ voltage signal had been attenuated to produce one-tenth of the $F_2$ voltage signal at the output of the op-amp 200 and is multiplied by 10 in the divider 202, the output to lead 150 from the setpoint percentage calculator 116 is the ratio of the $F_2$ signal to the $F_1$ signal, or equal to the percentage setting of setpoint 2 for the slaved injector mass flow controller 34.

The summation of the setpoint signals, which will be from 0 to 1 each case, is accomplished at the summation amplifier 148. The summation amplifier 148 includes four operational amplifiers 206, 208, 210 and 212 which are each portions of a single Quad Op-Amp LM324N from National Semiconductor. The output signals from the setpoint percentage calculators 116 and 118 are supplied through 100K resistances 205 and 207 and leads 150 and 152, respectively, to the noninverting input terminal of op-amp 206. The signal at the common terminal between resistors 205 and 207 is the average of the voltages from setpoint percentage calculators 116 and 118. The inverting terminal of the op-amp 206 is connected through a 100K resistor to ground and through a 100K resistance feedback loop to the output terminal 14 providing a gain of 2, thereby. By taking the average of the two signals from 116 and 118 and then multiplying by two, we obtain the sum of the two signals. Similarly, the output leads 154 and 156 from the percentage calculators 120 and 122 are connected through 100K resistances 209 and 211 to the noninverting input terminal of the op-amp 208 in the summation amplifier 148 to provide the sum of the signals from calculators 120 and 122. The op-amp 208 also has its inverting input terminal connected through a 100K resistance to ground and through a 100K resistance feedback loop to the output terminal. The outputs of the op-amps 206 and 208 are connected through leads 214 and 126 each through 100K resistances to the noninverting input terminal of the op-amp 212. The op-amp 212 has its inverting input terminal connected through a 100K resistance to ground and through a 100K resistance feedback loop to the output terminal. The output of the op-amp 212 is connected by lead 218 through a 100K resistance to the noninverting input terminal of the op-amp 210.

Also supplied to the input of the op-amp 210 is a 1 volt signal produced by the 1 volt reference generator 158 which comprises a 680 ohm resistance connected to ground through a Zener diode 220 commercially available as Motorola 1N746 having a 3.3 volt breakdown potential. The 1 volt signal is picked off by a potentiometer 222 which is connected in parallel across the Zener diode 220. The 1 volt signal is supplied through a lead 224 through a 100K resistance to the noninverting input terminal of the op-amp 210. The inverting input terminal of op-amp 210 is connected through a 100K resistance to ground and through a 100K resistance feedback loop to the output terminal. As in the op-amps 206, 208 and 212, the op-amp 210 receives the average of the two input signals at the noninverting input terminal and having a gain of 2 produces an output equal to the sum of the two output signals. The output of the op-amp 210 is connected to the output lead 160 and provides a signal equal to the sum of the setpoints for the mass flow controllers 34, 35, 36 and 37 plus 1 which signal is fed to the divider 162.

The divider 162 comprises an op-amp 230 such as a Texas Instruments UA747CN and an integrated circuit two-quadrant divider 232 which may be an Analog Devices AD535. The input lead 164 to the op-amp 230 is connected to the inverting terminal and supplies a signal equal to the sum of the silane signal plus the phosphine signal and the silane error signal or as expressed in equation (7) as the numerator [F(SiH4)+F(PH3)+(SiH4 Error)]. Lead 164 connects to the noninverting input terminal of op-amp 230 through a 37.4K resistance with the input terminal connected to ground through a 16.2K resistance. The inverting terminal of the op-amp 230 is connected to the output terminal through a 15K resistor feedback loop. The input signal supplied through lead 164 is attenuated so that the output of the op-amp 230 is three-tenths of the voltage representing the total flow as expressed in the numerator of equation (7). The output of the op-amp 230 is connected to terminal Z2 by lead 234 while the output of the summation amplifier 148 is connected by lead 160 to terminal X1 of the integrated circuit divider 232. The divider 232 as shown multiplies the input signal to Z2 by 10 making the numerator equal to 3 times the total flow signal in view of the three-tenths attenuation associated with op-amp 230. This multiplication of the total flow signal FT by a factor of three is necessitated by the difference in flow responses of the individual injector flow controllers 33, 34, 35, 36 and 37 as compared to the silane flow meter 47. Since the flow controllers have a response of 10 sccm/volt while the flow meter has a response of 30 sccm/volt, the voltage signal representing FT must be multiplied by 3 to relate it to actual flow on a comparable or normalized basis to that used for the injectors. The output of the integrated circuit divider 232 is passed through an op-amp unity gain buffer 236 and is equal to $F_1$ as is expressed in equation (7). This output signal equal to $F_1$ is then supplied through lead 184 to the multiplexer 198 from whence it controls the master mass flow controller 33. This output signal from the divider 162 is also supplied through lead 182 to the setpoint percentage calculators 116, 118, 120 and 122 and to the setpoint gain controls 100, 102, 104 and 106 for the purpose explained above.

In order to provide the total gas flow signal to the divider 162 along with the error signal, there are provided the error amplifier 174 and the setpoint summing amplifier 166. The error amplifier 174 includes operational amplifiers 240 and 242. Op-amp 240 is a portion of an LM324N Quad Op-Amp from National Semiconductor and op-amp 242 is a National Semiconductor LM741CN. The noninverting input terminal of the op-amp 240 is supplied with a voltage equal to the silane setpoint which is supplied through lead 244 through a 10K resistor to the noninverting terminal. A 200K resistance is connected from the noninverting input terminal of op-amp 240 to ground. Lead 178 supplies the signal from the silane flow meter 47 to the inverting input terminal through a 10K resistance. The inverting input terminal is connected through a 200K resistance feedback loop to the output terminal to produce a gain of 20 in the op-amp 240. The op-amp 240 functions as a differential amplifier to compare the silane setpoint signal with the silane flow meter signal producing an error signal equal to the difference between the two signals multiplied by a factor of twenty. This output is supplied through a 100K resistor to the lead 172 to the summing setpoint amplifier.

The other op-amp 242 has the silane setpoint signal connected through a 10K resistor to the noninverting input terminal thereof and the silane flow meter signal from lead 178 connected through a 10K resistor to the inverting input terminal, there being a 120 ohm resistor connected between the two input terminals. The output terminal is connected to the junction of a 56K resistance biased at +15 volts and a 560 ohm resistance, the 56K resistance being connected to an LED signal light by lead 181. When the silane flow meter signal is less than the silane setpoint by an amount approximately equal to 0.20 volts or more, the voltage across the input terminals of op-amp 242 switch the comparator to source a positive voltage to forward bias the LED 180.

The setpoint summing amplifier 166 includes three operational amplifiers, 260, 262 and 264, each of which is part of an LM324N Quad Op-Amp from National Semiconductor. The input lead 168 is supplied with a voltage signal equal to the phosphine mass flow controller 55 setpoint signal. The lead 168 connects to the noninverting input terminal of the op-amp 260 through a 63.4K resistance and the noninverting input terminal is also connected to ground through a 33.2K resistance. The inverting input terminal of the op-amp is connected to the output terminal through a 33K resistance feedback resistance. This network produces a 0.34 attenuation in the signal representing the phosphine setpoint. This attenuation is necessary to equalize the phosphine signal to the silane signal so both will be on a corresponding basis of 30 sccm per volt. The silane setpoint voltage and the equalized or attenuated phosphine setpoint voltage are summed in a noninverting summation amplifier 266 which comprises two series connected 100K resistances 266a and 266b, producing a voltage midway between the two applied voltages. The output terminal of op-amp 260 is connected by lead 268 to one of the 100K resistances 266a and the silane setpoint voltage is supplied to 100K resistance 266b by lead 170.

The point of connection between the two resistances 266a and 266b is connected to the noninverting input terminal of the op-amp 262. The inverting input terminal is connected through a 100K resistance to ground and through a 100K resistance feedback loop to the output terminal. The op-amp 262 so connected provides a gain of 2 which provides a voltage equal to the sum of the silane and phosphine setpoint voltage signals. The signal from summation amplifier 266 is equal to the average of the two input signals which, when multiplied by 2, equals the sum of the input signals.

The op-amp 264 has its noninverting terminal connected to the output of op-amp 262 through a 100K resistance 265 while the lead 172 connects the noninverting terminal of op-amp 264 to the output terminal of op-amp 240 through 100K resistance 267. Resistances 265 and 267 comprise a summation amplifier with the common terminal being connected to supply the average of the outputs of op-amps 262 and 240 to the noninverting input terminals of op-amp 264. The op-amp 264 has its inverting input terminal connected to ground through a 100K resistance and to the output terminal through a 100K resistance feedback loop. This results in a gain of 2 in the op-amp 264 producing a signal in the output lead 164 to the divider 162 equal to the total flow FT of silane and phosphine plus or minus the silane error signal.

For the purpose of controlling the transmission of control signals from the divider 162 and from the setpoint gain controls 100, 102, 104 and 106, there are provided two National Semiconductor CD4053 analog multiplexers 198 and 298 which basically control the start up and shut down of the system. These multiplexers 198 and 298 are digitally controlled analog switches having low "ON" impedance and very low "OFF" leakage currents.

Before start up, the silane setpoint signal which may vary from 0 to 5 volts, is supplied from a control panel potentiometer (not shown) to a lead 300 which connects to terminal 12 (AO) of the multiplexer 298. The output from this signal will appear at terminal 14, AZ when the logic select input voltage at pin 11 is low. Before deposition begins, the enable signal, which is high, is connected through lead 302 to pins 9, 10 and 11 of multiplexer 298 and 198 through a 2.4K resistor which is also connected to ground through a 4.7K resistor. The enable signal is also applied to transistors 304 and 306 through lead 308 and two resistors, a 2.7K resistor connected to the base of transistor 304 which is a Texas Instruments PNP transistor TIP 125 and a 33K resistor connected to the base of transistor 306 which is a Fairchild NPN transistor 2N2219.

During normal operation, the mass flow controllers 33, 34, 35, 36 and 37 are connected to 12 volt power supply 310 by leads 312. While the disable signal on lead 308 is high, the transistor 304 is biased off and the transistor 306 conducts, clamping the lead 312 at ground potential thereby assuring that the flow controllers 33, 34, 35, 36 and 37 will remain closed and so that no hunting or searching will occur.

Before start up, an approximate negative 0.6 volts from VEE, pin 7 is applied to pin 13, Al by a conductor 314 which connects to pins 7, 13, 1 and 3 in both of the multiplexers 198 and 298. While the enable signal is high, the output to pin 14, AZ is the −0.6 volts from pin 13, Al, which is transmitted to the error amplifier 174 and the summing amplifier 166 by lead 316. With the negative voltage 0.6 being supplied to the op-amp 242 in the error amplifier 174, there will be a negative voltage to the error indicator 180 so no error will be signaled.

When deposition begins, the enable signal on leads 302 and 308 goes low applying ground potential to the bases of transistors 304 and 306 causing 304 to conduct and 306 to switch off providing the 12 volt power to the mass flow controllers 33, 34, 35, 36 and 37. In addition, the enable signal then causes the multiplexers 198 and 298 to transmit the setpoint signals from the leads 184, 108, 110, 112 and 114 to their respective mass flow controllers 33, 34, 35, 36 and 37. Thus, the multiplexers 198 and 298 maintain the injector mass flow controllers in a closed position until such time as deposition is commenced. This condition is important since a so-called "soft start" is almost essential in many chemical vapor deposition processes including the low temperature oxide CVD process.

The foregoing description of a preferred embodiment of our invention provides a significantly improved system for controlling the flow of gases used in connection with a chemical vapor deposition process. Because of the substantial problems in obtaining uniform deposition of oxide layers throughout the length of the process zone and across the diameter of the wafers being processed, it is very necessary to provide apparatus in which the flow of mixed gases through the individual injectors may be varied to compensate for and eliminate the above described variations. The use of mass flow controllers on each of the injectors has improved this situation. However, the practical needs in processing situations to vary the gas mixture and vary the total gas flow without varying the relative percentages of flow through the various injectors, was not met by any of the prior art systems. By providing the master/slave relationship between the various injectors, we have provided a system with much more flexibility than heretofore was available. The means for accomplishing the desired functions are simple, practical and low in cost.

We claim:

1. In a gas system the combination comprising a pair of controlled sources of gases to be mixed and introduced into a reaction zone, one of said gas sources being controlled by a source mass flow controller and the other source having a mass flow meter which provides an error signal when the flow through said meter departs from a preselected setpoint flow, said sources being connected to a mixing manifold for mixing said gases downstream of said controller and said meter, a plurality of gas injectors for delivering said mixed gases to areas in said reaction zone, said injectors being connected to said mixing manifold with mass flow controllers for controlling the flow of mixed gases to each of said injectors, said injector mass flow controllers being regulated by a common control having means to deliver a selected portion of the total flow through each of the various injectors under conditions of varying total flow of said mixed gases, said error signal being applied to said common control for said injector mass flow controllers to regulate said total flow of mixed gas to cause said flow through said meter to conform to said setpoint value.

2. The combination of claim 1 wherein said common control comprises a master control for one of said injectors and slaved controls for the other of said injectors, said slaved controls having individual control means for selecting a rate of flow through each injector which is a selected percentage of the rate of flow in the injector with said master control.

3. The combination of claim 2 wherein said master control is regulated by a divider which responds to a signal representing the sum of the selected rates of flow of the gases to be mixed divided by the sum of the selected percentages for the gas flows in said other injectors plus one.

4. The combination of claim 3 wherein said error signal is amplified and added to said signal representing the sum of the selected rates of flow of the gases to be mixed to correct said flow through said meter to said setpoint value.

5. The combination of claim 1 or 4 wherein said error signal is supplied to a comparator to produce an alarm signal when said error exceeds a predetermined rate of flow.

6. In a gas system for use in a chemical vapor deposition process, the combination comprising a pair of controlled sources of gases to be mixed and introduced in the heated zone of a process tube within a diffusion furnace, one of said gas sources being controlled by a mass flow controller and the other source having a mass flow meter which provides an error signal when the flow through said meter departs from a preselected setpoint flow, said sources being connected to a mixing manifold downstream of said controller and said meter, a plurality of gas injectors for delivering said mixed gases to contiguous areas lengthwise in the heated zone of said process tube, said injectors being connected to said mixing manifold with mass flow controllers for controlling the flow of mixed gases to each of said injectors, one of said injector mass flow controllers being a master controller regulating said gas mixture flow to a preselected level, the others of said injector mass flow controllers being slaved to said master controller and having controls to provide in said slaved controllers flows of selected percentage of the flow through said master controller, said error signal being applied to regulate the total flow of mixed gas through said slaved controllers to cause said flow through said meter to conform to said setpoint value.

7. The combination of claim 6 wherein said controls for said slaved controllers each including adjustable controls to select a rate of flow from zero to one hundred percent of the rate of flow through said master controller, means for adding said selected percentages and dividing that sum plus one into a signal representing the total flow of the gases to be mixed to produce a signal to control said master controller.

8. The combination of claim 7 wherein said total flow signal comprises the sum of the control signal for said mass flow controller for said one of said gas sources and of a signal indicative of the setpoint flow of said other gas flowed through said mass flow meter and of said error signal amplified.

9. The combination of claim 8 wherein said error signal is supplied to a comparator to produce an alarm signal when said error exceeds a predetermined rate of flow.

10. A gas flow control system for use in the processing of semiconductor materials in a low temperature, low pressure process in which a mixture of pyrophoric gases and oxygen are separately injected into the heated zone of a process tube of a diffusion furnace comprising a sealed process tube having means for evacuating gases contained therein and for heating wafers contained in a proces zone, first gas injection means including a plurality of gas injectors extending into said process tube, said injectors having exit orifices spaced lengthwise of said process zone, second gas injection means disposed in said process tube in spaced relation from said first gas injection means and coextensive therewith, individual mass flow controllers connected to control the gas flow to each of said injectors of said first gas injection means, a gas mixing manifold having means for supplying a gas mixture to said individual mass flow controllers, two separate sources of pyrophoric gas connected to deliver gas to said manifold, a mass flow controller to establish a selected rate of flow of one of said pyrophoric gases, the flow rate of the other of said pyrophoric gases being regulated by the mass flow controllers which regulate the individual injector flows.

11. The gas flow control system of claim 10 wherein the flow of said other pyrophoric gas is measured by a mass flow meter which produces a signal proportional to the rate of flow, means for producing a setpoint signal indicative of the selected rate of flow of said other pyrophoric gas, master control means regulating said mass flow controllers which regulate the individual injector flows to conform the flow measured in said mass flow meter to said selected rate of flow.

12. The gas flow control system of claim 11 wherein said master control means includes a comparator which compares the signal from said mass flow meter to said setpoint signal to produce an error signal which is applied to correct the flows in said individual injectors to eliminate the error between the metered flow and the setpoint flow.

13. The gas flow control system of claim 11 wherein said mass flow controllers which regulate the individual injector flows include a master mass flow controller and a plurality of slaved mass flow controllers, said slaved mass flow controllers having selectively adjustable controls to regulate the individual flows to a selected percentage of the flow in said master mass flow controller.

14. The gas flow control system of claim 13 including a comparator for comparing said mass flow meter signal and said setpoint signal to produce an error signal and means for applying said error signal to the control of said master mass flow controller whereby the flow through all of the injectors will be adjusted to eliminate said error signal while maintaining the same relative flows in the individual injectors.

* * * * *